United States Patent [19]

Hashimoto

[11] Patent Number: 5,159,369
[45] Date of Patent: Oct. 27, 1992

[54] INTEGRATED CIRCUIT FOR ELECTROSTATIC DISCHARGE TESTING

[75] Inventor: Yoshinori Hashimoto, Nara, Japan

[73] Assignee: Sharp Kabushiki Kaisha, Japan

[21] Appl. No.: 750,057

[22] Filed: Aug. 27, 1991

[30] Foreign Application Priority Data

Sep. 10, 1990 [JP] Japan .................. 2-240922

[51] Int. Cl.⁵ .......................................... G01R 31/26
[52] U.S. Cl. .............................. 324/158 R; 324/73.1; 371/15.1; 361/212
[58] Field of Search .............. 324/158 R, 73.1, 500; 307/303; 437/8; 371/15.1, 22.1, 21.2; 361/212, 225

[56] References Cited

U.S. PATENT DOCUMENTS

| | | | |
|---|---|---|---|
| 4,638,246 | 1/1987 | Blank et al. | 324/500 |
| 4,954,772 | 9/1990 | Funakoshi | 324/158 R |
| 5,012,185 | 4/1991 | Ohjugi | 324/158 R |
| 5,047,710 | 9/1991 | Mahoney | 324/158 R |
| 5,065,091 | 11/1991 | Tobita | 324/158 R |

*Primary Examiner*—Vinh Nguyen
*Attorney, Agent, or Firm*—Nixon & Vanderhye

[57] ABSTRACT

An integrated circuit device is provided in an integrated circuit which has an input/output terminal device for inputting a signal onto an internal input line and outputting a signal from an internal output line during a normal operation of the integrated circuit. The integrated circuit device includes a test terminal through which a test mode signal is inputted, the test mode signal being inputted when a withstand voltage test is to be performed with respect to the integrated circuit. The integrated circuit device also includes a switching device disposed between the internal input line and the input/output terminal device and between the internal output line and the input/output terminal device, to which the test mode signal is inputted from the test terminal, for electrically coupling the internal input and output lines with the input/output terminal device during the normal operation and disconnecting the internal input and output lines with the input/output terminal device when the test mode signal is inputted.

6 Claims, 3 Drawing Sheets

INTEGRATED CIRCUIT FOR ELECTROSTATIC DISCHARGE TESTING

BACKGROUND OF THE INVENTION

1. Field of the Invention

The present invention relates to an integrated circuit device preferably provided in a semiconductor integrated circuit, which requires a electrostatic discharge test.

2. Description of the Related Arts

In one method of electrostatic discharge tests of semiconductor integrated circuits, it is necessary to firstly executing a test program with respect to the semiconductor integrated circuit. For example, if the device to be tested by the object of the withstand electrostatic voltage test is a memory device, the test program is executed with respect to the memory device. By this execution of the test program, the input and output terminals of the memory device are made in such an electrically insulated condition that the input and output are rejected at these terminals. This condition is suitable for the electrostatic discharge test, and thus the test is performed after this suitable condition of the memory device is achieved.

In another method of electrostatic discharge tests, a test wire board for the semiconductor integrated circuit is utilized. The test wire board is connected to an electric power source, and has a socket, to which the terminals of the semiconductor integrated circuit can be engaged in, and a control circuit, which is adapted to transmit a control signal to the socket. By engaging the terminals of the semiconductor integrated circuit into the socket, the semiconductor integrated circuit is set in a condition suitable for the electrostatic discharge test.

In the above mentioned first testing method using the test program, however, it is necessary to make an exclusive test program individually with respect to each different kind of the semiconductor integrated circuit, so as to set up the above mentioned condition suitable for the electrostatic discharge test. In the above mentioned second method using the test wire board, it is necessary to make an exclusive test wire board individually with respect to each different kind of the semiconductor integrated circuit, so as to achieve the above mentioned condition suitable for the electrostatic discharge test. Accordingly, depending on the structure of each semiconductor integrated circuit to be tested, the exclusive test program or test wire board is necessary, with a serious drawback of making the electrostatic discharge testing process complicated and costly.

SUMMARY OF THE INVENTION

It is therefore an object of the present invention to provide an integrated circuit device, which simplify the electrostatic discharge test.

According to the present invention, the above mentioned object can be achieved by an integrated circuit device provided in an integrated circuit which has an input/output terminal device for inputting a signal onto an internal input line and outputting a signal from an internal output line during a normal operation of the integrated circuit. The integrated circuit device includes a test terminal through which a test mode signal is inputted, the test mode signal being inputted when a electrostatic discharge test is to be performed with respect to the integrated circuit. The integrated circuit device also includes a switching device disposed between the internal input line and the input/output terminal device and between the internal output line and the input/output terminal device, to which the test mode signal is inputted from the test terminal, for electrically coupling the internal input and output lines with the input/output terminal device during the normal operation and disconnecting the internal input and output lines with the input/output terminal device when the test mode signal is inputted.

In the integrated circuit device, the switching device is disposed between the internal input line and the input/output terminal device and between the internal output line and the input/output terminal device. Accordingly, when the test mode signal is inputted from the test terminal to the switching device, the switching device electrically couples the internal input and output lines with the input/output terminal device. Thus, the integrated circuit can operate normally by use of this input/output terminal device. On the other hand, when the electrostatic discharge test is to be performed, and when the test mode signal is inputted, the switching device disconnects the internal input and output lines with the input/output terminal device. Thus, a condition suitable for the electrostatic discharge test can be established in the integrated circuit. Consequently, since the condition suitable for the electrostatic discharge test can be achieved just by inputting the test mode signal, the evaluation process of the electrostatic discharge test of the integrated circuit can be made quite simplified and economizied.

Further objects and advantages of the present invention will be apparent from the following description of the preferred embodiment of the invention as illustrated in the accompanying drawings.

DETAILED DESCRIPTION OF THE PREFERRED EMBODIMENT

A preferred embodiment of the present invention will be described below with reference to the accompanying drawings.

Figure 1:
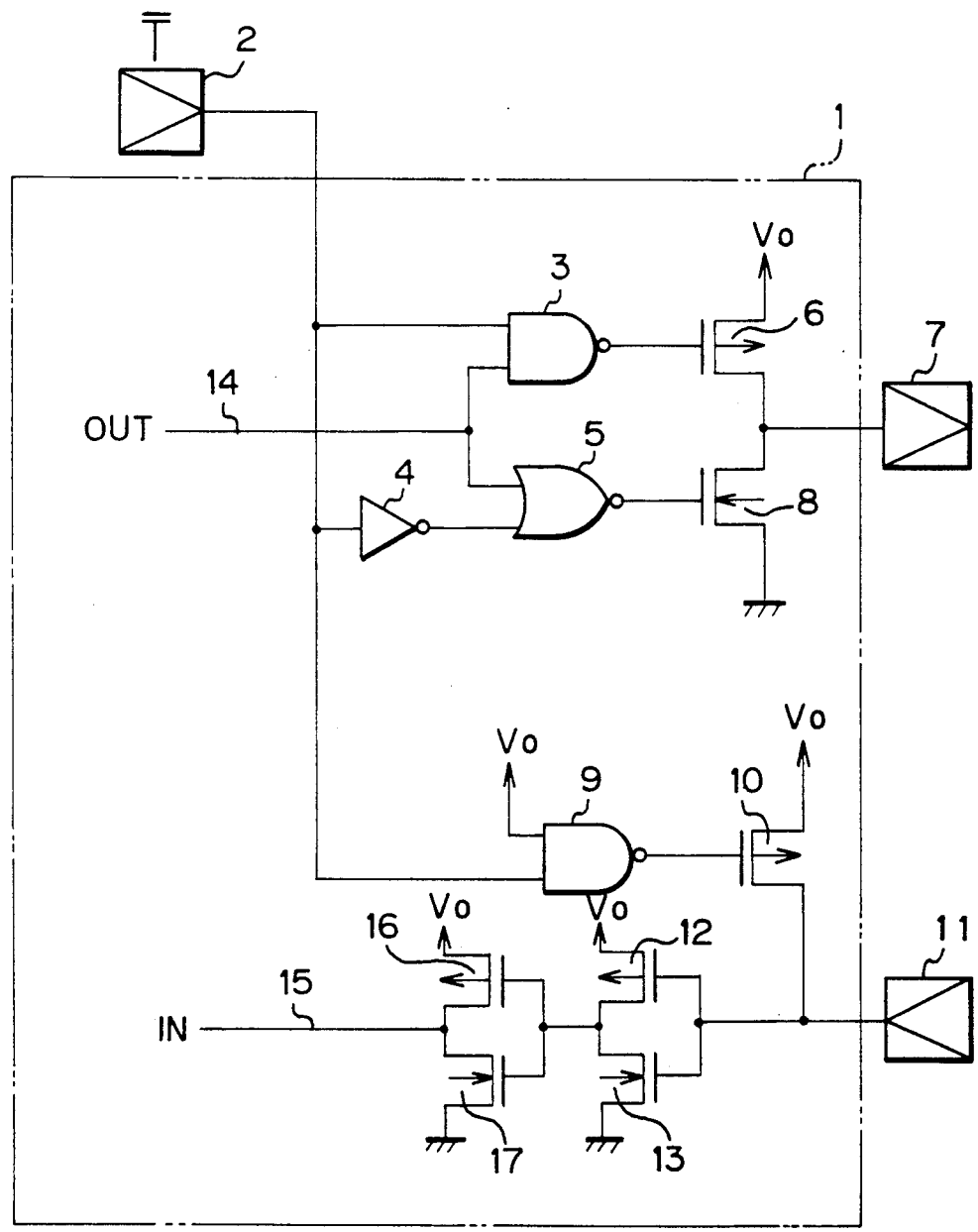
FIG. 1 is a circuit diagram of an integrated circuit as a first embodiment of the present invention.

In FIG. 1, a semiconductor integrated circuit 1 is an IC (Integrated Circuit) realized as a LSI (Large Scaled Integrated) circuit, for example.

The semiconductor integrated circuit 1 is provided with a test terminal 2, a NAND gate circuit 3, an inverter circuit 4, a NOR gate circuit 5, a P channel transistor 6, an output terminal 7, an N channel transistor 8, a NAND gate circuit 9, a P channel transistor 10, an input terminal 11, a P channel transistor 12, an N channel transistor 13, a P channel transistor 16, and an N channel transistor 17.

In the semiconductor integrated circuit 1, the test terminal 2 is connected to one terminal of the NAND gate circuit 3, while the other terminal of the NAND gate circuit 3 is connected to an internal output line 14 from which the signal processed in the semiconductor integrated circuit 1 is supplied. The test terminal 2 is also connected to one terminal of the NOR gate circuit 5 through the inverter circuit 4, while the other terminal of the NOR gate circuit 5 is connected to the internal output line 14.

The NAND gate circuit 3 is connected to the gate of the P channel transistor 6. The drain of the P channel transistor 6 is connected to a power source voltage VO, and the source of the P channel transistor 6 is connected to the output terminal 7. The NOR gate circuit 5 is connected to the gate of the N channel transistor 8. The source of the N channel transistor 8 is connected to a ground, and the drain of the N channel transistor 8 is connected to the output terminal 7.

Further, the test terminal 2 is connected to one terminal of the NAND gate circuit 9, while the other terminal of the NAND gate circuit 9 is connected to the power source voltage VO. The NAND gate circuit 9 is connected to the gate of the P channel transistor 10. The source of the P channel transistor 10 is connected to the power source voltage VO, and the drain of the P channel transistor 10 is connected to the input terminal 11.

The input terminal 11 is also connected to the gate of the P channel transistor 12 and the gate of the N channel transistor 13. The source of the P channel transistor 12 is connected to the power source voltage V0, and the drain of the P channel transistor 12 is connected to the gate of the P channel transistor 16 and the gate of the N channel transistor 17. The source of the N channel transistor 13 is connected to the ground, and the drain of the N channel transistor 13 is connected to the gate of the P channel transistor 16 and the gate of the N channel transistor 17. The source of the P channel transistor 16 is connected to the power source voltage V0, and the drain of the P channel transistor 16 is connected to an internal input line 15 through which an input signal is supplied to the semiconductor integrated circuit 1. The source of the N channel transistor 17 is connected to the ground, and the drain of the N channel transistor 17 is connected to the internal input line 15.

The semiconductor integrated circuit 1 is normally used under the condition that the test terminal 2 is at the high level (non-active). By setting the test terminal 2 at the high level, the signal same as the output signal OUT from the internal output line 14 is outputted from the output terminal 7, and the signal same as the input signal from the input terminal 11 is inputted onto the internal input line 15 as the input signal IN. The P channel transistor 10 serves as a pull up resistor for the input terminal 11. The input terminal 11 is, for example, a reset terminal to which a reset signal is inputted in a low active condition so as to reset the semiconductor integrated circuit 1. In case that the semiconductor integrated circuit 1 is in a non-reset condition, even when the high level (non-active) condition at the reset terminal is changed, the semiconductor integrated circuit 1 is prevented from being reset since the P channel transistor 10 serves as the pull up resistor so that the internal input line 15 is fixed in the high level.

Under the condition that the test terminal 2 is low active, a test mode signal T is inputted through the test terminal 2, and the semiconductor integrated circuit 1 is set in a condition suitable for the withstand electrostatic voltage test. By the change in the output of the test terminal 2 to the low level, the output of the NAND gate circuit 3 is turned to be high level, and the P channel transistor 6 is turned off. At the same time, the output of the inverter circuit 4 is turned to be high level, and the N channel transistor 8 is turned off since the output of the NOR gate circuit 5 is turned to be low level. Accordingly, the output terminal 7 is set in an high impedance condition i.e. an insulated condition. On the other hand, since the output of the NAND gate circuit 9 is turned to be high level, the P channel transistor 10 is turned off so that the P channel transistor 10 does not serve as the pull up resistor anymore. Thus, the input terminal 11 is set in an insulated condition, since the input terminal 11 is connected to the gates of the transistors 12 and 13.

Figure 2:
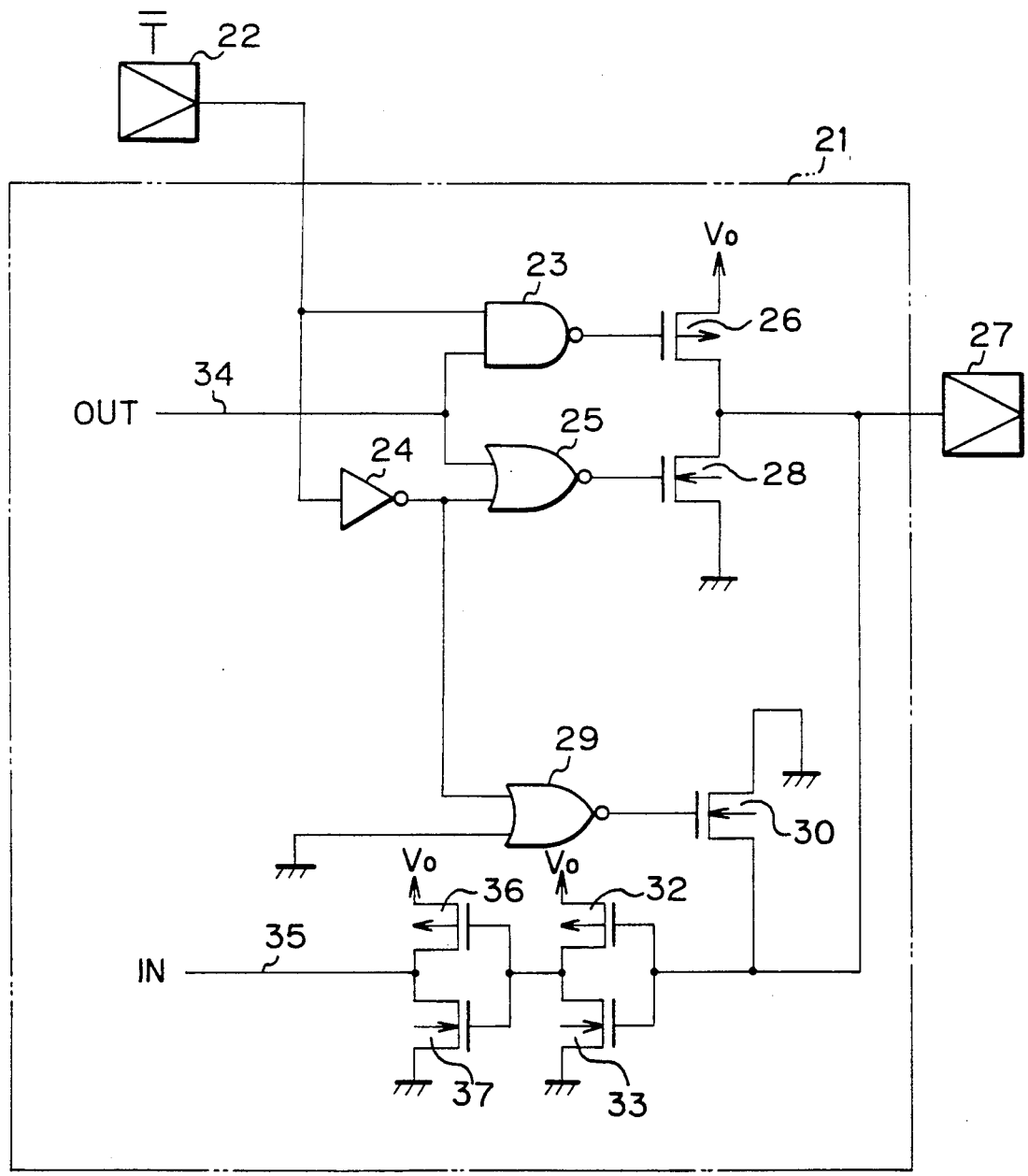
FIG. 2 is a circuit diagram of an integrated circuit as a second embodiment of the present invention.

FIG. 2 shows another preferred embodiment of the present invention.

In FIG. 2, a semiconductor integrated circuit 21 is an IC realized as a LSI, for example, in a same manner as the above mentioned first embodiment.

The semiconductor integrated circuit 21 is provided with a test terminal 22, a NAND gate circuit 23, an inverter circuit 24, a NOR gate circuit 25, a P channel transistor 26, an input/output terminal 27, an N channel transistor 28, a NOR gate circuit 29, an N channel transistor 30, a P channel transistor 32, an N channel transistor 33, a P channel transistor 36, and an N channel transistor 37.

In the semiconductor integrated circuit 21, the test terminal 22 is connected to one terminal of the NAND gate circuit 23, while the other terminal of the NAND gate circuit 23 is connected to an internal output line 34 from which the signal processed in the semiconductor integrated circuit 21 is supplied. The test terminal 22 is also connected to one terminal of the NOR gate circuit 25 through the inverter circuit 24, while the other terminal of the NOR gate circuit 25 is connected to the internal output line 34.

The NAND gate circuit 23 is connected to the gate of the P channel transistor 26. The source of the P channel transistor 26 is connected to a power source voltage V0, and the drain of the P channel transistor 26 is connected to the input/output terminal 27. The NOR gate circuit 25 is connected to the gate of the N channel transistor 28. The source of the N channel transistor 28 is connected to a ground, and the drain of the N channel transistor 28 is connected to the input/output terminal 27.

Further, the test terminal 22 is connected to one terminal of the NOR gate circuit 29, while the other terminal of the NOR gate circuit 29 is connected to the ground. The NOR gate circuit 29 is connected to the gate of the N channel transistor 30. The source of the N channel transistor 30 is connected to the ground, and the drain of the N channel transistor 30 is connected to the input/output terminal 27.

The input/output terminal 27 is also connected to the gate of the P channel transistor 32 and the gate of the N channel transistor 33. The source of the P channel transistor 32 is connected to the power source voltage V0, and the drain of the P channel transistor 32 is connected to the gate of the P channel transistor 36 and the gate of the N channel transistor 37. The source of the N channel transistor 33 is connected to the ground, and the drain of the N channel transistor 33 is connected to the gate of the P channel transistor 36 and the gate of the N channel transistor 37. The source of the P channel transistor 36 is connected to the power source voltage V0, and the drain of the P channel transistor 36 is connected to an internal input line 35 through which an input signal is supplied to the semiconductor integrated circuit 21. The source of the N channel transistor 37 is connected to the ground, and the drain of the N channel transistor 37 is connected to the internal input line 35.

The semiconductor integrated circuit 21 is normally used under the condition that the test terminal 22 is at the high level (non-active). By setting the test terminal 22 at the high level, the signal same as the output signal OUT from the internal output line 34 is outputted from the input/output terminal 27, and the signal same as the input signal from the input/output terminal 27 is inputted onto the internal input line 35 as the input signal IN. The N channel transistor 30 serves as a pull down resistor for the input/output terminal 27. The input/output terminal 27 is, for example, a reset terminal to which a reset signal is inputted in a high active condition so as to reset the semiconductor integrated circuit 21. In case that the semiconductor integrated circuit 21 is in a non-reset condition, even when the low level (non-active) condition at the reset terminal is changed, the semiconductor integrated circuit 21 is prevented from being reset since the transistor 30 serves as the pull down resistor so that the internal input line 35 is fixed in the low level.

Under the condition that the test terminal 22 is low active, a test mode signal T is inputted through the test terminal 22, and the semiconductor integrated circuit 21 is set in a condition suitable for the electrostatic discharge test. By the change in the output of the test terminal 22 to the low level, the output of the NAND gate circuit 23 is turned to be high level, and the P channel transistor 26 is turned off. At the same time, the output of the inverter circuit 24 is turned to be high level, and the N channel transistor 28 is turned off since the output of the NOR gate circuit 25 is turned to be low level. On the other hand, since the output of the NOR gate circuit 29 is turned to be low level, the N channel transistor 30 does not serve as the pull down resistor anymore. Thus, the input/output terminal 27 is set in an insulated condition, since the input/output terminal 27 is connected to the gates of the transistors 32 and 33.

Figure 3:
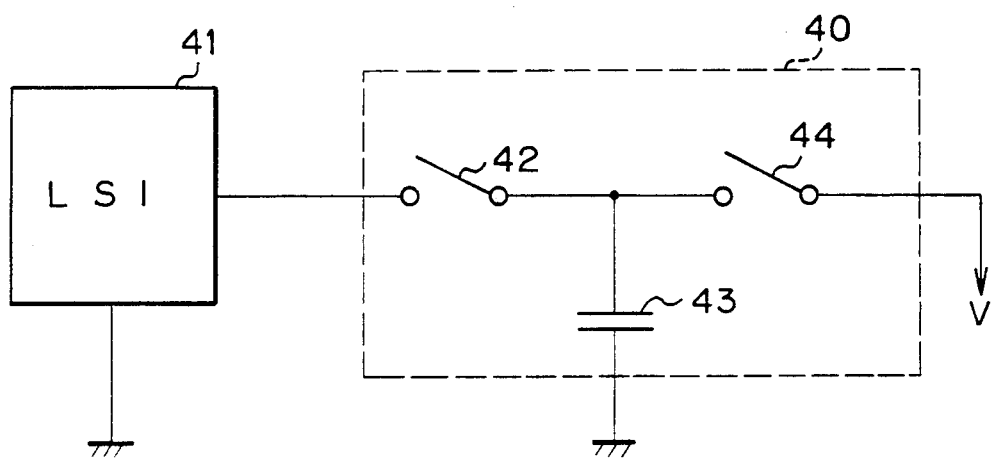
FIG. 3 is a block diagram showing a voltage application set up for an electrostatic discharge test available for the integrated circuit of FIG. 1 by use of a voltage applying device.

FIG. 3 shows a first step (voltage application step) set up for the electrostatic discharge test by use of a voltage applying device 40, with respect to a semiconductor integrated circuit (LSI) 41, which is equivalent to either the semiconductor integrated circuit 1 or 21 of the above mentioned first or second embodiment.

In FIG. 3, the voltage applying device 40 is provided with a switch 42, a capacitor 43, and a switch 44. The ground terminal of the semiconductor integrated circuit 41 is grounded. The switch 42 is connected to a terminal to be tested of the semiconductor integrated circuit 41. The switch 42 is also connected to a power source voltage V through the switch 44. The switch 42 is also connected to the capacitor 43.

When applying a certain test voltage to the semiconductor integrated circuit 41, at first, the switch 44 is closed, so that the capacitor 43 is charged. After finishing this charge of the capacitor 43, the switch 44 is opened, and then the switch 42 is closed, so that the charged voltage in the capacitor 43 is applied to the tested terminal of the semiconductor integrated circuit 41.

Figure 4:
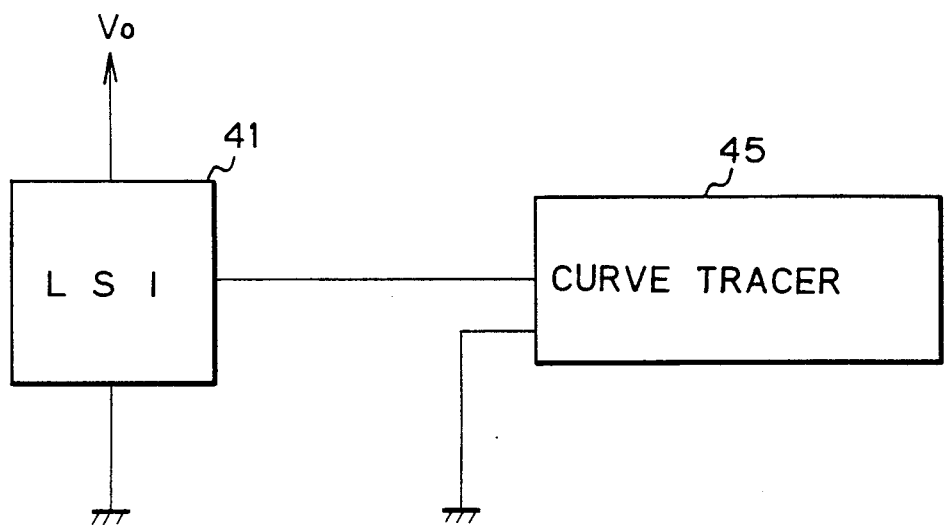
FIG. 4 is a block diagram showing an evaluation set up for an withstand voltage test available for the integrated circuit of FIG. 1 by use of a measuring device.

FIG. 4 shows a subsequent step (test evaluation step) set up for the electrostatic discharge test by use of a measuring device i.e. a curve tracer 45 for measuring the insulation condition of the semiconductor integrated circuit 41.

In FIG. 4, the curve tracer 45 is connected to the terminal to be tested of the semiconductor integrated circuit 41, which power source terminal is connected to the power source voltage VO and which ground terminal is grounded. The semiconductor integrated circuit 41, which is equivalent to the aforementioned semiconductor integrated circuit 1 or 21 in FIGS. 1 or 2, is set in a condition suitable for the electrostatic discharge test, by use of the aforementioned test terminal 2 or 22. Here, the electrostatic discharge test includes all of the testing processes from the electrostatic voltage applying process to the test evaluation process with respect to each tested terminal.

By use of the curve tracer 45, the voltage is applied between the ground terminal and the terminal to be tested of the semiconductor integrated circuit 41, while the generated current is measured. From the thusly measured current value and the applied voltage value, the resistance at the tested terminal can be obtained. From the thusly obtained resistance, it can be estimated by how much the insulation condition is destroyed, with respect to the tested terminal. Accordingly, the evaluation of the electrostatic discharge test can be performed with respect to each tested terminal of the semiconductor integrated circuit 41.

As described in detail above, according to the present embodiment, it is possible to set the semiconductor integrated circuit 1, 21 in the condition suitable for the electrostatic discharge test, by inputting the test mode signal T while the test terminal 2, 22 is in the low active condition. Accordingly, since it is quite easy to establish the condition suitable for the electrostatic discharge test, the process of the electrostatic discharge test can be quite simplified and economized.

Many widely different embodiments of the present invention may be constricted without departing from the spirit and scope of the present invention. It should be understood that the present invention is not limited to the specific embodiments described in this specification, except as defined in the appended claims.

What is claimed is:

1. An integrated circuit device provided in an integrated circuit which has an input/output terminal means for inputting a signal into an internal input line and outputting a signal from an internal output line during a normal operation of said integrated circuit, comprising:

a test terminal through which a test mode signal is inputted, said test mode signal being inputted when an electrostatic discharge test is to be performed with respect to said integrated circuit; and a switching means responsively connected to the test terminal and connected between said internal input line and said input/output terminal means and between said internal output line and said input/output means, to which said test mode signal is inputted from said test terminal, for electrically coupling said internal input and output line with said input/output terminal means during said normal operation and disconnecting said internal input and output lines with said input/output terminal means when said test mode signal is inputted.

2. An integrated circuit device according to claim 1, wherein said input/output terminal means comprises an input terminal and an output terminal.

3. An integrated circuit device according to claim 1, wherein said input/output terminal means comprises an input/output terminal.

4. An integrated circuit device according to claim 1, wherein said switching means comprises a transistor as a switching element.

5. An integrated circuit device according to claim 1, wherein said input/output terminal means is electrically insulated when said switching means disconnects said internal input and output lines from said input/output terminal means.

6. An integrated circuit device according to claim 1, wherein said integrated circuit comprises a LSI circuit, and said integrated circuit device is included in said LSI circuit.

* * * * *